United States Patent
Timinger

(10) Patent No.: US 8,072,301 B2
(45) Date of Patent: Dec. 6, 2011

(54) SUPERCONDUCTIVE MAGNET SYSTEM FOR A MAGNETIC RESONANCE EXAMINATION SYSTEM

(75) Inventor: Holger Timinger, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 168 days.

(21) Appl. No.: 12/531,352

(22) PCT Filed: Mar. 14, 2008

(86) PCT No.: PCT/IB2008/050945
§ 371 (c)(1),
(2), (4) Date: Sep. 15, 2009

(87) PCT Pub. No.: WO2008/114184
PCT Pub. Date: Sep. 25, 2008

(65) Prior Publication Data
US 2010/0045409 A1    Feb. 25, 2010

(30) Foreign Application Priority Data
Mar. 19, 2007    (EP) ....................... 07104405

(51) Int. Cl.
*H01F 1/00* (2006.01)
*H01F 6/00* (2006.01)
(52) U.S. Cl. ........................................... 335/216
(58) Field of Classification Search ............ 335/216
See application file for complete search history.

(56) References Cited

U.S. PATENT DOCUMENTS

| | | | |
|---|---|---|---|
| 4,930,318 A * | 6/1990 | Brzozowski | 62/51.1 |
| 5,093,645 A * | 3/1992 | Dorri et al. | 335/216 |
| 5,317,296 A * | 5/1994 | Vermilyea et al. | 335/216 |
| 5,333,464 A * | 8/1994 | Laskaris et al. | 62/51.1 |
| 5,394,129 A | 2/1995 | Obasih et al. | |
| 5,394,130 A | 2/1995 | Xu et al. | |
| 5,647,218 A * | 7/1997 | Kuriyama et al. | 62/6 |
| 5,737,927 A * | 4/1998 | Takahashi et al. | 62/51.1 |
| 5,960,868 A * | 10/1999 | Kuriyama et al. | 165/135 |
| 7,193,336 B1 * | 3/2007 | Mueller et al. | 307/113 |
| 2002/0070829 A1 * | 6/2002 | Yanagi et al. | 335/216 |
| 2002/0171521 A1 * | 11/2002 | Ries | 335/216 |
| 2006/0236709 A1 | 10/2006 | Steinmeyer | |
| 2006/0279387 A1 * | 12/2006 | Nemoto et al. | 335/216 |
| 2007/0001521 A1 | 1/2007 | Kruip et al. | |

FOREIGN PATENT DOCUMENTS

| | | |
|---|---|---|
| DE | 10038119 A1 | 2/2002 |
| DE | 102004061869 A1 | 7/2006 |
| DE | 102005028414 A1 | 12/2006 |
| EP | 0350264 A1 | 1/1990 |

* cited by examiner

*Primary Examiner* — Anh Mai
*Assistant Examiner* — Alexander Talpalatskiy

(57) ABSTRACT

A superconductive magnet system with a super conductive magnet is provided with a cooling system. A thermal switch is configured to thermally (de)couple the superconductive magnet from/to the cooling system so that the magnet can be decoupled from the cooling system e.g. in the event of a quench.

7 Claims, 2 Drawing Sheets

SUPERCONDUCTIVE MAGNET SYSTEM FOR A MAGNETIC RESONANCE EXAMINATION SYSTEM

FIELD OF THE INVENTION

The invention pertains to a superconductive magnet system, in particular for a magnetic resonance examination system

BACKGROUND OF THE INVENTION

Such a superconductive magnet is known from the European patent application EP 0 350 264. The known superconductive magnet comprises a superconductive quench protected coil. The quench protected coil includes several layers of superconductive wire co-wound with copper stabiliser wires. A strip of electrically conductive foil is located between adjacent layers of wire. This configuration provides an improved quench propagation.

SUMMARY OF THE INVENTION

An object of the invention is to provide a superconductive magnet, in particular for a magnetic resonance examination system, which is able to fast ramp-down.

This object is achieved in the magnet system of the invention which comprises
a super conductive magnet
a cooling system and
a thermal switch configured to thermally (de)couple the superconductive magnet from/to the cooling system.

In the event a quench of the magnet is detected, the thermal switch is opened so as to decouple the superconductive magnet from the cooling system. A quench occurs when the superconductive coil windings of the superconductive magnet locally become resistive and the electrical current through the coil windings generates more heat. In the event of a quench, the magnet is rapidly ramped down by heating the coil windings in a spatially distributed way to make the entire coil windings resistive and prevent the occurrence of hot spots. Because the thermal switch decouples the super conductive magnet from the cooling system, the heating in the event of a quench is not counteracted by the cooling system. Hence, the efficiency is improved of the distributed heating in the event of a quench. Hot spots are more effectively avoided. In this way it is avoided that the process of quenching becomes unstable. Hence rapid dissipation of all stored magnetic energy at small hotspots is counteracted and damage of the magnet is avoided.

In operation, the coil windings are cooled below their critical temperature so that the electrically conductive coil windings are in a superconductive state. To cool the coil windings a thermal conduction is provided between the coil windings and the cold head of the cooling system. The thermal conduction thermally directly couples the cold head and the coil windings. The thermal conduction does not require the conduction-cooled superconducting magnet to be covered by a fluid coolant. Instead, only some parts of the magnet are directly thermally connected to the cold-head of a cryocooler. The connections can be made of good thermal conductors like copper or aluminium, or heat pipes. For example, the thermal conduction can be formed as thermally conductive rings around the coil windings and which are connected to the coil windings by thermally conductive bridges. For example an assembly of thin copper-wires are suited as thermal connectors which avoids or at least minimises eddy-currents. Further, flexible branch-like metal, e.g. copper, connectors may be employed to thermally connect several parts of the magnet with the cryocooler. In another version of the thermal conduction, for example some parts of the magnet are thermally connected to the cryocooler via thick copper or aluminium wires or bars, or using heat pipe technology. The complete magnet is then cooled by exploiting the thermal conduction of the superconducting material itself, which can be provided by the coil windings' substrate or stabilizer material. The thermal switch is provided between the cold head and the thermal conduction. This type of magnet system does not require the use of cryogenic coolant (such as liquid He), to cool the coil windings. For these cryogenless type of magnet system, rapid ramp down is enabled by opening the thermal switch in the event of a local quench.

In a further aspect of the invention, the coil windings contain a high-temperature superconductive material. Suitable high-temperature materials are $YBa_2Cu_3O_{7+}$ ($T_c$=93 K), $Bi_2Sr_2Ca_2Cu_3O_{10}$ (Tc=110 K), or $RuSr_2(Gd, Eu, Sm)Cu_2O_8$ (Tc=58 K). The high-temperature materials can be operated at a higher temperature and thus do not require expensive and complex He-bath cooling, but can be cooled by the cold head via the thermal conduction. Nevertheless, the invention provides that the magnet system having high-temperature superconductive coil windings can be ramped down rapidly in the event of a quench.

In one aspect of the invention the thermal switch can be realised in the form of a mechanical switch based on magnetostriction or piezoelectricity. Magnetostriction entails that the material expands or contracts anisotropically under the influence of an external magnetic field. Piezoelectricity entials that the material expands or contracts anisotropically under the influence of an external electric field. In this embodiment the thermal switch includes a magnetostrictive or piezoelectric body which (de)couples the cold head from/ to the thermal conduction. The body is in excellent mechanical and thus thermal contact during superconducting magnet operation. In case of a detected quench, an electrical or magnetic field is applied to the component which changes the dimension of the component and thus prevents mechanical/ thermal contact of the component to the other thermal conductors.

In a further aspect of the invention a gas/fluid-based thermal switch can be employed, such as a thermosyphon or heat pipe. Heat pipes exhibit an effective thermal conductivity which is much higher than that of copper or aluminium. The working fluid evaporates at the warm end of the heat pipe and transfers to the cold end, where it condensates. From there, it is transferred back to the warm end—either by gravity or by using a special wick-like structure in the heat pipe. However, heat pipes work only properly if the temperatures at the warm and cold end correspond to the temperatures at which the working gas/fluid evaporates and condensates. Therefore, the thermal conduction can easily be switched off, e.g. by heating the condenser section or cooling it additionally (switching off additional heaters) so that the working gas/fluid freezes. In both cases, thermal conduction stops almost instantaneously. Further, heat pipes show excellent thermal conduction and the pipe itself can be built of (electrical)insulator-like materials so that eddy currents are avoided. The heaters can be realized by standard resistive or inductive heaters.

The magnet system of the invention is particularly suitable to be employed in a magnetic resonance examination system. The magnetic resonance examination system generates and receives spatially encoded magnetic resonance signals and reconstructs a magnetic resonance image of an object to be examined from the acquired magnetic resonance signals. In particular the object is a patient to be examined and medical diagnostic images are reconstructed from the magnetic resonance signals from the patient to be examined.

BRIEF DESCRIPTION OF THE DRAWING

These and other aspects of the invention will be elucidated with reference to the embodiments described hereinafter and with reference to the accompanying drawing wherein.

DETAILED DESCRIPTION OF THE PREFERRED EMBODIMENTS

Figure 1:
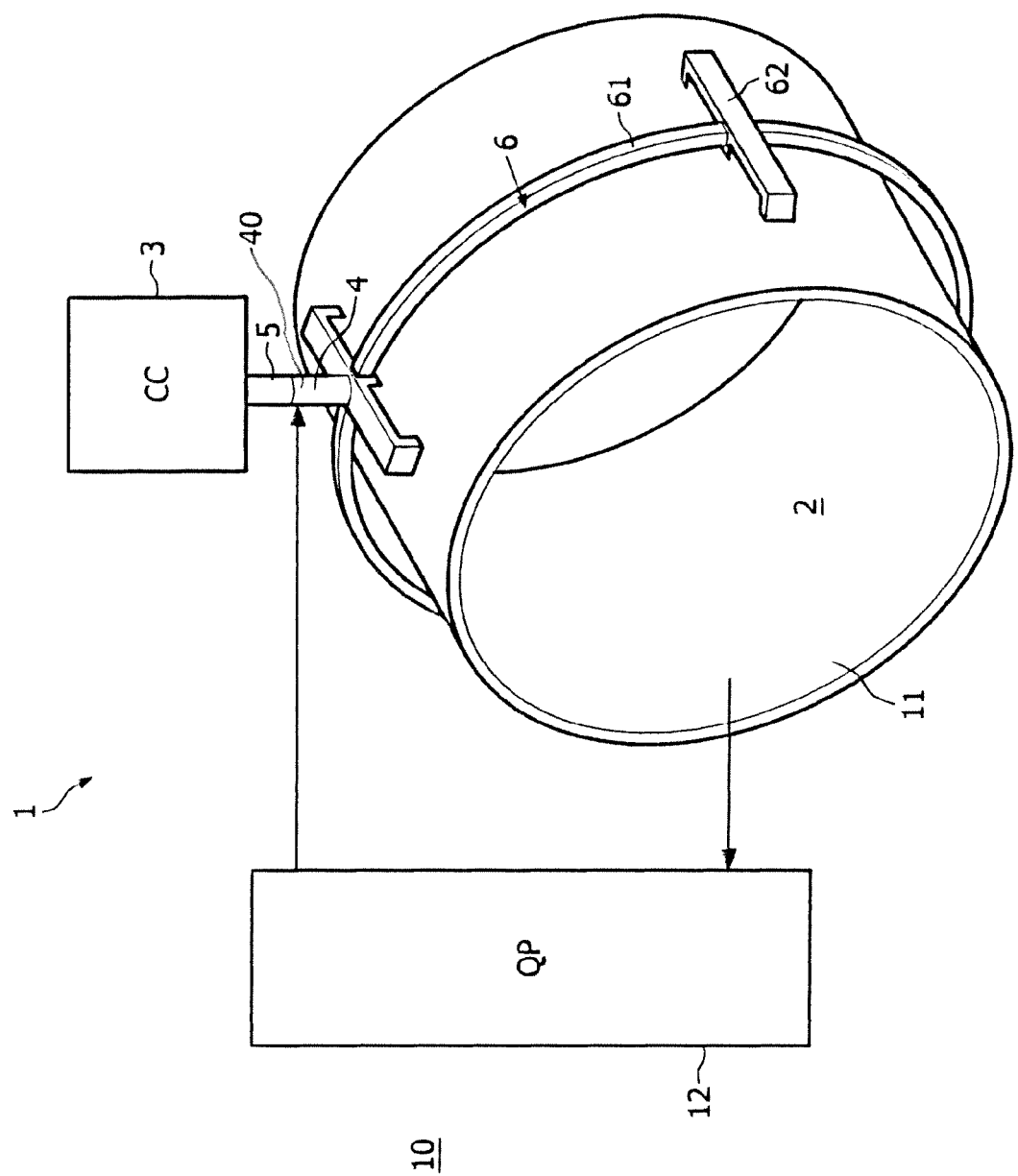
FIG. 1 shows a schematic representation of the magnet system of the invention, with a magnetoresistive or piezoelectric thermal switch.

FIG. 1 shows a schematic representation of the magnet system 1 of the invention. The magnet system 1 includes the superconductive magnet 2 which has a cylindrical form. The magnet 2 has one or more superconductive coil windings (not shown explicitly). The coil windings are made superconductive by cooling them sufficiently below their critical temperature for superconduction. It is noted that the critical temperature depends on electrical current density and magnetic field strength in the material of the coil windings. Notably, as the electrical current increases the critical temperature decreases and even superconductivity ceases when the electrical current density is higher than a critical electrical current density. Also, the critical temperature decreases when magnetic field strength increases. As the magnetic field strength is higher than a critical field strength superconductivity ceases. A magnet quench may occur when e.g. locally the temperature exceeds the critical temperature which may be caused by a local increase of the magnetic field or electrical current density. The coil windings are in thermal contact with a thermal conduction 6 that for example has one or several rings 61 e.g. formed from thin copper wires that hardly allow eddy currents and bridges 62 that thermally connect the cryocooler directly to the coil windings. Cooling is provided by a cryocooler 3 that is coupled to the thermal conduction 6 by way of the thermal switch 4 that is located between the cold head 5 of the cryocooler and the thermal conduction 6. Optionally, thermal switches can be provided at the bridges 62 to allow local decoupling from the cryocooler in the vicinity of a local quench. The cooling system formed by the cryocooler 3, cold head 5 and the thermal conduction 6 is (de)coupled to and from the superconductive magnet 2 by the thermal switch 4. The thermal switch is located between the cold head 5 and the thermal conduction. This achieves that a single thermal switch suffices to thermally (de)couple the entire magnet with all its windings from the cold head 5.

The thermal switch can be realised in the form of a mechanical switch based on magnetostriction or piezoelectricity. Magnetostriction entails that the material expands or contracts anisotropically under the influence of an external magnetic field. Piezoelectricity entails that the material expands or contracts anisotropically under the influence of an external electric field. In this embodiment the thermal switch includes a magnetostrictive or piezoelectric body 40 which (de)couples the cold head from/to the thermal conduction. The body is in excellent mechanical and thus thermal contact during superconducting magnet operation. In case of a detected quench, an electrical or magnetic field is applied to the component which changes the dimension of the component and thus prevents mechanical/thermal contact of the component to the other thermal conductors.

Figure 2:
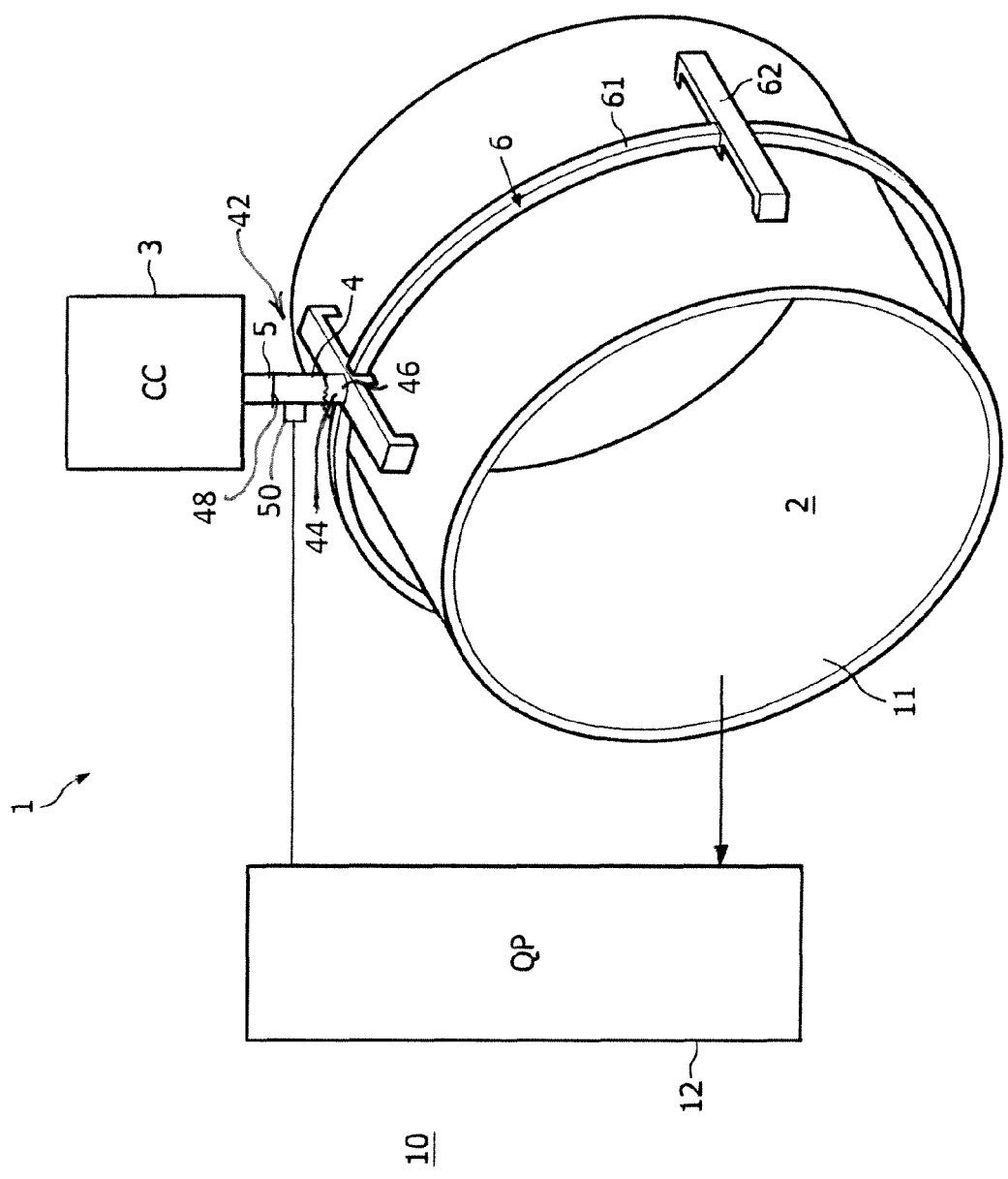
FIG. 2 shows a schematic representation of the magnet system with a heat pipe thermal switch.

In a different embodiment of FIG. 2, the functions of the thermal switch and the thermal conductors can be integrated e.g. when the thermal conductors are realized as heat pipes 42. Then simple heaters 50 attached to the heat pipe can be used to switch-off the thermal conduction of the heat pipe rapidly and thus decouple the magnet from the crycooler.

More specifically, a gas/fluid-based thermal switch can be employed, such as a thermo syphon or heat pipe 42. Heat pipes exhibit an effective thermal conductivity which is much higher than that of copper or aluminium. The working fluid 44 evaporates at the warm end 46 of the heat pipe and transfers to the cold end 48, where it condensates. From there, it is transferred back to the warm end—either by gravity or by using a special wick-like structure in the heat pipe. However, heat pipes work only properly if the temperatures at the warm and cold end correspond to the temperatures at which the working gas/fluid evaporates and condensates. Therefore, the thermal conduction can easily be switched off, e.g. by heating the condenser section or cooling it additionally (switching off additional heaters) so that the working gas/fluid freezes. In both cases, thermal conduction stops almost instantaneously. Further, heat pipes show excellent thermal conduction and the pipe itself can be built of (electrical)insulator-like materials so that eddy currents are avoided. The heaters 50 can be realized by standard resistive or inductive heaters.

A quench protection system 10 is provided which includes several voltage taps and/or temperature sensors 11 (only one is explicitly shown in the drawing) which monitor the local voltage and temperature at several locations. Together with the voltage taps, e.g. platinum-based temperature sensors can be employed. Should the voltage in or the temperature of the coil windings locally exceed a threshold value, then the coil windings locally (may) become resistive and the risk of further heating and a quench is imminent. The threshold value of the voltage or temperature of the coil windings is set so that exceeding the threshold value represents disappearance of the superconductivity in the coil windings. The sensors provide a sensor signal to the quench controller 12 of the quench protection system. the quench controller's software interprets the sensor signals and if a quench is detected to be imminent, the quench controller 12 opens the thermal switch 4 to decouple magnet 2 from the cryocooler 3, notably the cold head 5.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A superconductive magnet system comprising:
    a cooling system including a cold head;
    a superconductive magnet including superconducting coil windings;
    thermal conduction path between the cold head and the coil windings which transfers thermal energy from the coil windings to the cold head;
    a thermal switch disposed in the thermal conduction path between the cold head and the thermal conduction coil windings; and
    a quench controller which detects when a quench of the superconductive magnet is imminent and responds to detecting an imminent quench by opening the thermal switch to thermally disconnect the cold head from the coil windings.

2. The super superconductive magnet system as claimed in claim 1, wherein the coil windings contain a high-temperature superconducting material.

3. A superconductive magnet system comprising:
- a super conductive magnet including electrically conductive coil windings;
- a cooling system including a cold head; and
- a thermal switch disposed between the cold head and the coil windings and configured to thermally (de)couple the superconductive magnet from/to the cooling system, the thermal switch including magnetostrictive or piezoelectric body which thermally (de)couples the cold head from/to the coil windings and a quench controller which detects when a quench of the superconductive magnet is imminent and responds to detecting an imminent quench by controlling the magnetostrictive or piezoelectric body to open the thermal switch thermally disconnecting the cold head from the coil windings.

4. A superconductive magnet system comprising:
- a super conductive magnet including electrically conductive coil windings;
- a cooling system including a cold head; and
- a thermal switch disposed between the cold head and the coil windings and configured to thermally (de)couple the superconductive magnet from/to the cooling system, wherein the thermal switch is formed by a heat pipe which (de)couples the cold head from/to the coil winding and the heat pipe including:
  - a working fluid which evaporates at a warm end in thermal communication with the coil winding, condenses at a cold end thermally connected with the cold head, and returns to the warm end; and
  - a temperature controller which regulates a temperature at the warm end and/or at the cold end of the heat pipe to stop the working fluid from transforming thermal energy between the warm and cold ends and a quench controller which detects when a quench of the superconducting magnet is imminent and responds to detecting an imminent quench by controlling the temperature controller to stop the working fluid from transferring thermal energy between the warm and cold ends.

5. The superconductive magnet system as claimed in claim 1, wherein the thermal switch includes a magnetstrictive or piezoelectric body which thermally (de)couples the cold head from/to the coil windings.

6. The superconductive magnet as claimed in claim 1, wherein the thermal switch includes a heat pipe which includes:
- a working fluid which evaporates at a warm end which is thermally connected to the coil windings and condenses at a cold end thermally connected with the cold head; and
- a temperature controller which regulates a temperature of the heat pipe to stop conduction of heat by the working fluid from the warm end to the cold end in response to the quench controller determining the imminent quench.

7. The superconducting magnet system as claimed in claim 3, wherein the cold head and the coil windings are thermally interconnected by a thermally conductive mechanical structure and wherein the magnetostrictive or piezoelectric body changes shape to create a mechanical and thermal discontinuity in the thermally conductive mechanical structure.

* * * * *